United States Patent
Yahata et al.

(10) Patent No.: US 11,961,718 B2
(45) Date of Patent: *Apr. 16, 2024

(54) PLASMA PROCESSING METHOD AND PLASMA PROCESSING APPARATUS

(71) Applicant: Tokyo Electron Limited, Tokyo (JP)

(72) Inventors: Shojiro Yahata, Miyagi (JP); Tetsuji Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 179 days.

This patent is subject to a terminal disclaimer.

(21) Appl. No.: 17/186,711

(22) Filed: Feb. 26, 2021

(65) Prior Publication Data

US 2021/0272781 A1 Sep. 2, 2021

(30) Foreign Application Priority Data

Mar. 2, 2020 (JP) ................................ 2020-035038

(51) Int. Cl.
*H01L 21/00* (2006.01)
*H01J 37/32* (2006.01)

(52) U.S. Cl.
CPC .. *H01J 37/32724* (2013.01); *H01J 37/32091* (2013.01); *H01J 37/32431* (2013.01);
(Continued)

(58) Field of Classification Search
None
See application file for complete search history.

(56) References Cited

U.S. PATENT DOCUMENTS

| 11,032,899 B2 * | 6/2021 | Uchida | H01J 37/32926 |
| 11,227,773 B2 * | 1/2022 | Tamamushi | B08B 7/0035 |

(Continued)

FOREIGN PATENT DOCUMENTS

| JP | 2015-216261 A | 12/2015 | |
| WO | WO-2015174271 A1 * | 11/2015 | ........ H01J 37/32091 |

OTHER PUBLICATIONS

JP-2001085398-A, Ishibashi et al., Plasma Treatment Apparatus, Mar. 30, 2001, abstract. (Year: 2001).*

*Primary Examiner* — Sylvia MacArthur
*Assistant Examiner* — Michelle Crowell
(74) *Attorney, Agent, or Firm* — Nath, Goldberg & Meyer; Jerald L. Meyer; Tanya E. Harkins

(57) ABSTRACT

A plasma processing method of processing a substrate with plasma in a plasma processing apparatus. The plasma processing apparatus includes: a chamber configured to accommodate a substrate; an upper electrode structure forming an upper portion of the chamber and including a temperature-controlled plate, an electrode plate disposed below the temperature-controlled plate, and an electrostatic attractor, the electrostatic attractor including a contact surface, an attraction surface, a first electrode, and a second electrode; a power supply configured to apply a voltage to the first and second electrodes; and a temperature obtaining portion configured to acquire a temperature distribution of the electrode plate. The plasma processing method includes: acquiring, by the temperature obtaining portion, the temperature distribution; applying a first voltage to the first electrode and applying a second voltage to the second electrode according to the acquired temperature distribution; and processing the substrate with plasma.

18 Claims, 10 Drawing Sheets

(52) U.S. Cl.
CPC .. *H01J 37/32522* (2013.01); *H01J 37/32541* (2013.01); *H01J 37/32568* (2013.01); *H01J 37/32532* (2013.01); *H01J 37/32642* (2013.01); *H01J 2237/2007* (2013.01); *H01J 2237/3343* (2013.01)

(56) References Cited

U.S. PATENT DOCUMENTS

| | | | |
|---|---|---|---|
| 11,443,924 B2* | 9/2022 | Tamamushi | H01J 37/32091 |
| 2003/0032301 A1* | 2/2003 | Dhindsa | C23C 16/4586 |
| | | | 438/758 |
| 2006/0221540 A1* | 10/2006 | Himori | H01J 37/32568 |
| | | | 361/234 |
| 2015/0129112 A1* | 5/2015 | Saito | H01J 37/32522 |
| | | | 156/89.12 |
| 2019/0295828 A1* | 9/2019 | Hirayama | H05H 1/46 |
| 2020/0107429 A1* | 4/2020 | Uchida | H01J 37/32027 |
| 2020/0234930 A1* | 7/2020 | Tamamushi | H01J 37/3244 |
| 2020/0234931 A1* | 7/2020 | Tamamushi | H01J 37/32706 |

* cited by examiner

PLASMA PROCESSING METHOD AND PLASMA PROCESSING APPARATUS

CROSS-REFERENCE TO RELATED APPLICATION

This application is based upon and claims the benefit of priority from Japanese Patent Application No. 2020-035038, filed on Mar. 2, 2020, the entire contents of which are incorporated herein by reference.

TECHNICAL FIELD

Exemplary embodiments of the present disclosure relate to a plasma processing method and a plasma processing apparatus.

BACKGROUND

Patent Document 1 discloses an upper electrode of a plasma processing apparatus. The upper electrode includes an electrode plate and a plate, which is in contact with the electrode plate. The top surface of the electrode plate is in contact the bottom surface of the plate. An electrostatic attractor is provided between the electrode plate and the plate. The electrostatic attractor is made of ceramic and is fixed to the bottom surface of the plate via a clamp.

PRIOR ART DOCUMENT

Patent Document

Patent Document 1: Japanese Laid-Open Patent Publication No. 2015-216261

SUMMARY

According to an embodiment of the present disclosure, there is provided a plasma processing method of processing a substrate with plasma in a plasma processing apparatus. The plasma processing apparatus includes a chamber, an upper electrode structure, a power supply, and a temperature obtaining portion. The chamber is configured to accommodate a substrate. The upper electrode structure constitutes the upper portion of the chamber. The upper electrode structure includes a temperature-controlled plate, an electrode plate disposed below the temperature-controlled plate, and an electrostatic attractor interposed between the electrode plate and the temperature-controlled plate. The electrostatic attractor includes a contact surface that is in contact with the bottom surface of the temperature-controlled plate, an attraction surface that attracts the top surface of the electrode plate, a first electrode, and a second electrode. The power supply is configured to apply a voltage to the first electrode and the second electrode. The temperature obtaining portion is configured to acquire a temperature distribution of the electrode plate. The plasma processing method includes an acquiring step, an applying step, and a processing step. In the acquiring step, the temperature distribution of the electrode plate is acquired by the temperature obtaining portion. In the applying step, a first voltage is applied to the first electrode and a second voltage is applied to the second electrode according to the acquired temperature distribution. In the processing step, the substrate is processed with plasma.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
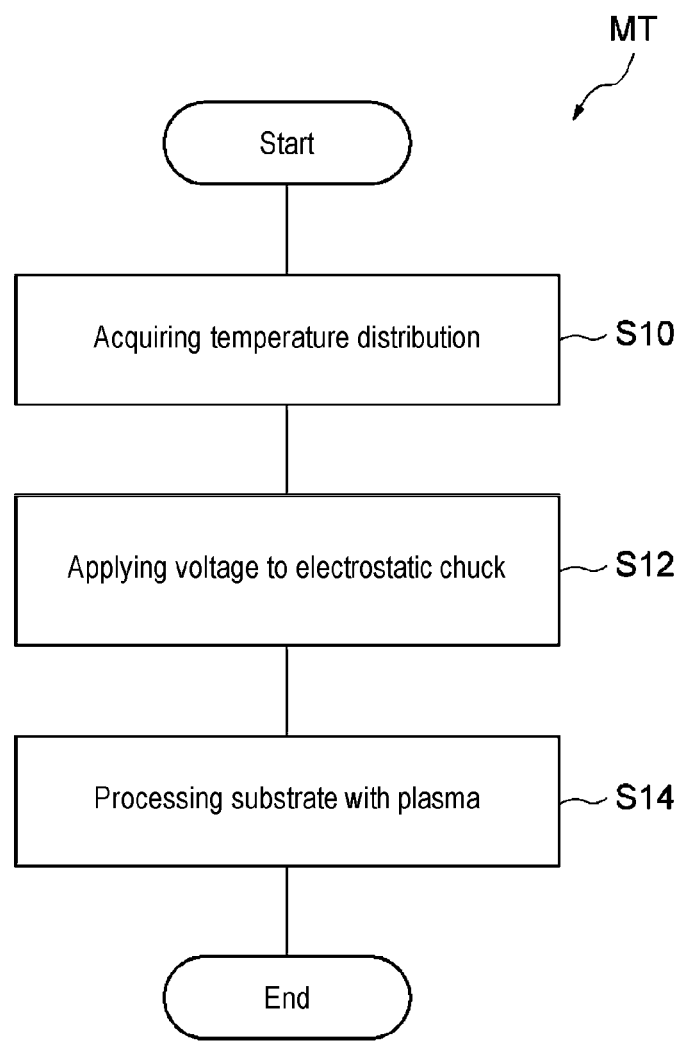
FIG. 1 is a flowchart illustrating a plasma processing method according to an exemplary embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the plasma processing apparatus of Patent Document 1, plasma is generated below the electrode plate. The temperature of the electrode plate rises due to the heat input from the plasma. When the electrode plate is pressed against the upper plate by the electrostatic attractor, the electrode plate is cooled by heat conduction. However, the plasma heat input may not be uniform with respect to the electrode plate. In addition, the interfacial thermal resistance between the electrode plate and the plate may vary with the use of the apparatus. The variation in the temperature of the electrode plate caused by such factors may affect a plasma processing process. In addition, depending on the process, it may be required to intentionally provide a temperature difference between a predetermined area and another area of the electrode plate. The plasma processing apparatus of Patent Document 1 has room for improvement in adjusting the temperature distribution of the electrode plate.

In an exemplary embodiment, a method of processing a substrate with plasma in a plasma processing apparatus is provided. The plasma processing apparatus includes a chamber, an upper electrode structure, a power supply, and a temperature obtaining portion. The chamber is configured to accommodate a substrate. The upper electrode structure constitutes the upper portion of the chamber. The upper electrode structure includes a temperature-controlled plate, an electrode plate disposed below the temperature-controlled plate, and an electrostatic attractor interposed between the electrode plate and the temperature-controlled plate. The electrostatic attractor includes a contact surface that is in contact with the bottom surface of the temperature-controlled plate, an attraction surface that attracts the top surface of the electrode plate, a first electrode, and a second electrode. The power supply is configured to apply a voltage to the first electrode and the second electrode. The temperature obtaining portion is configured to acquire a temperature distribution of the electrode plate. The method includes an acquiring step, an applying step, and a processing step. In the acquiring step, the temperature distribution of the electrode plate is acquired by the temperature obtaining portion. In the applying step, a first voltage is applied to the first electrode and a second voltage is applied to the second electrode according to the acquired temperature distribution. In the processing step, the substrate is processed with plasma.

In this method, the temperature distribution of the electrode plate is acquired, and a voltage is applied to the first electrode and the second electrode of the electrostatic attractor according to the acquired temperature distribution. As a result, in this method, the attractive force generated by the first electrode and the attractive force generated by the second electrode can be adjusted according to the temperature distribution of the electrode plate. Therefore, with this method, it is possible to flexibly adjust the temperature distribution of the upper electrode plate compared with the method in which a uniform attractive force is applied to the entire electrode plate.

In an exemplary embodiment, the electrode plate may be circular, the first electrode may be disposed at a position corresponding to the center of the electrode plate, and the second electrode may be disposed to surround the first electrode. In this case, with this method, it is possible to independently adjust the temperature of the central area of the electrode plate and the temperature of the area outside the central area of the electrode plate according to the temperature distribution.

In an exemplary embodiment, the temperature obtaining portion may include a first temperature sensor configured to detect the temperature of the electrode plate at the position where the first electrode is disposed and a second temperature sensor configured to detect the temperature of the electrode plate at the position where the second electrode is disposed. In this case, with this method, it is possible to acquire a temperature distribution including the temperature of the electrode plate at the position where the first electrode is disposed and the temperature of the electrode plate at the position where the second electrode is disposed.

In an exemplary embodiment, the applying step may include a step of applying a voltage to the first electrode and the second electrode such that a difference between the detected temperature of the first temperature sensor and the detected temperature of the second temperature sensor is equal to or smaller than a predetermined temperature threshold. In this case, with this method, it is possible to make the temperature of the electrode plate uniform.

In an exemplary embodiment, the electrostatic attractor may include a single body formed of a dielectric material, and the first and second electrodes may be provided inside the single body. In this case, with this method, it is possible to reduce the number of components of the apparatus compared with the case where the first electrode and the second electrode are respectively provided inside different bodies.

In an exemplary embodiment, the single body may be made of ceramic. In this case, with this method, it is possible to improve the heat resistance of the electrostatic attractor compared with the case where other materials are adopted.

In an exemplary embodiment, the single body may be made of an elastic dielectric material. In this case, with this method, it is possible to easily and appropriately assemble the electrode plate and the plate.

In an exemplary embodiment, the electrostatic attractor may include a first body made of a dielectric material and a second body separated from the first body and made of a dielectric material, the first electrode may be provided inside the first body, and the second electrode may be provided inside the second body. In this case, with this method, it is possible to flexibly arrange the electrostatic attractor compared with the case where the first electrode and the second electrode are provided inside a single body.

In an exemplary embodiment, the first body and the second body may be made of ceramic. In this case, with this method, it is possible to improve the heat resistance of the electrostatic attractor compared with the case where other materials are adopted.

In an exemplary embodiment, the first body and the second body may be made of an elastic dielectric material. In this case, with this method, it is possible to easily and appropriately assemble the electrode plate and the plate.

In an exemplary embodiment, the method may further include a step of repeating the acquiring step, the applying step, and the processing step. In this case, with this method, it is possible to repeatedly perform the adjustment of the temperature distribution of the electrode plate and the plasma processing of the substrate.

In another exemplary embodiment, a plasma processing apparatus is provided. The plasma processing apparatus includes a chamber, an RF power supply, an upper electrode structure, a power supply, a temperature obtaining portion, and a controller. The chamber is configured to accommodate a substrate. The RF power supply is configured to generate plasma. The upper electrode structure constitutes the upper portion of the chamber. The upper electrode structure includes a temperature-controlled plate, an electrode plate disposed below the temperature-controlled plate, and an electrostatic attractor interposed between the electrode plate and the temperature-controlled plate. The electrostatic attractor includes a contact surface that is in contact with the bottom surface of the temperature-controlled plate, an attraction surface that attracts the top surface of the electrode plate, a first electrode, and a second electrode. The power supply is configured to apply a voltage to the first electrode and the second electrode. The temperature obtaining portion is configured to acquire a temperature distribution of the electrode plate. The controller executes a process includes the acquiring step, the applying step, and the processing step. In the acquiring step, the temperature distribution of the electrode plate is acquired by the temperature obtaining portion. In the applying step, the power supply is controlled such that a first voltage is applied to the first electrode and a second voltage is applied to the second electrode according to the acquired temperature distribution. In the processing step, the substrate is processed with plasma.

In this apparatus, the temperature distribution of the electrode plate is acquired, and a voltage is applied to the first electrode and the second electrode of the electrostatic attractor according to the acquired temperature distribution.

As a result, in this apparatus, the attractive force generated by the first electrode and the attractive force generated by the second electrode can be adjusted according to the temperature distribution of the electrode plate. Therefore, with this apparatus, it is possible to flexibly adjust the temperature distribution of the upper electrode plate compared with the method in which a uniform attractive force is applied to the entire electrode plate.

Hereinafter, various exemplary embodiments will be described in detail with reference to the drawings. In each of the drawings, the same or corresponding parts will be denoted by the same reference numerals.

[Outline of Plasma Processing Method and Apparatus]

FIG. 1 is a flowchart illustrating a plasma processing method according to an exemplary embodiment. The plasma processing method illustrated in FIG. 1 (hereinafter referred to as a "method MT") is performed to process a substrate with plasma. More specifically, the method MT is performed in order to adjust the temperature of the upper electrode, which contributes to the generation of plasma, before or during substrate processing. The material and shape of a substrate to be processed by the method MT, gas type, and the like are not particularly limited.

Figure 2:
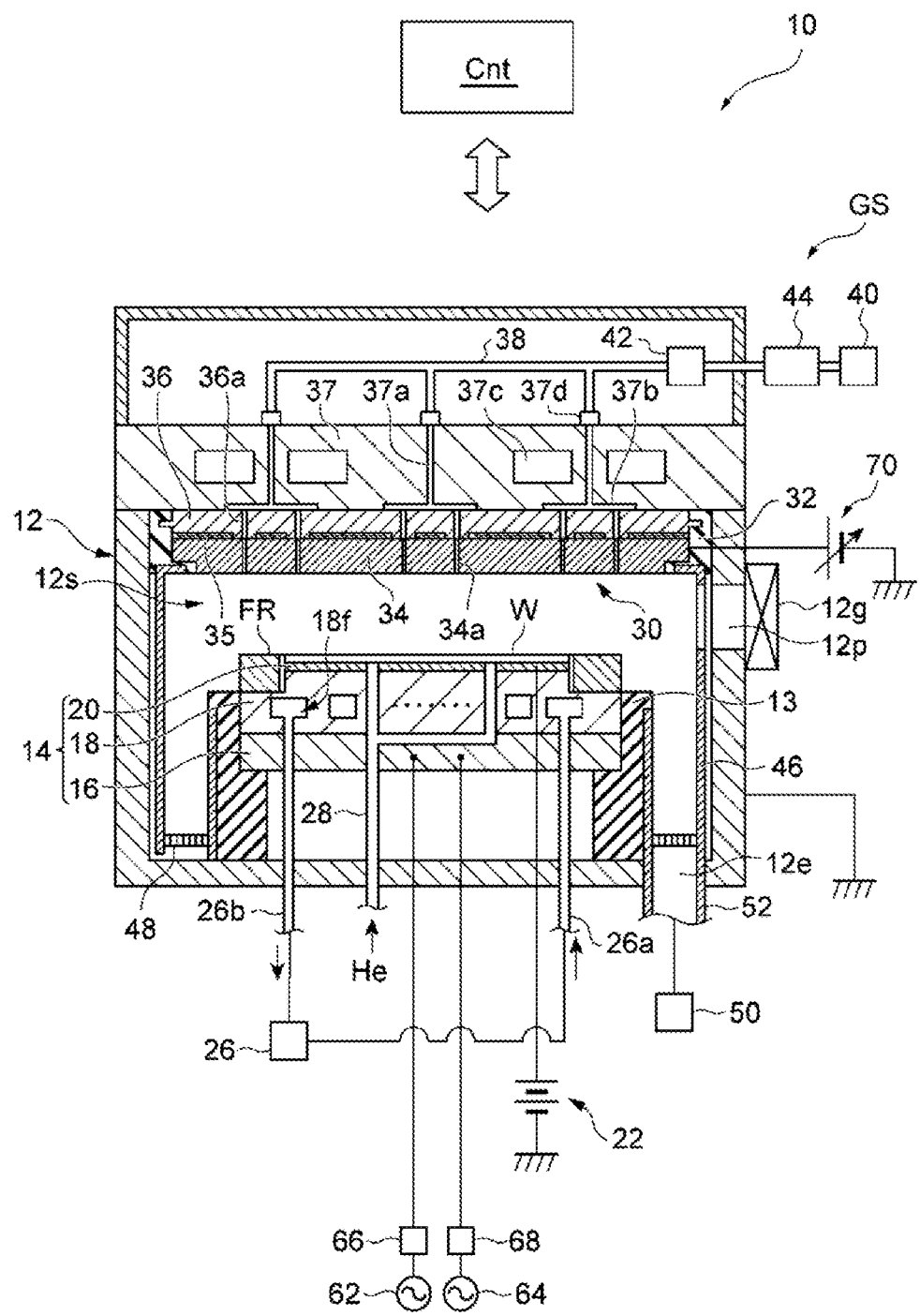
FIG. 2 is a view schematically illustrating a plasma processing apparatus according to an exemplary embodiment.

The method MT is performed in a plasma processing apparatus. FIG. 2 is a view schematically illustrating a plasma processing apparatus according to an exemplary embodiment.

The plasma processing apparatus 10 illustrated in FIG. 2 is a capacitively coupled plasma etching apparatus. The plasma processing apparatus 10 includes a chamber body 12. The chamber body 12 has a substantially cylindrical shape and includes an internal space 12s. The chamber body 12 is made of, for example, aluminum. The inner wall of the chamber body 12 is processed to have plasma resistance. For example, the inner wall of the chamber body 12 is anodized. The chamber body 12 is electrically grounded.

A passage 12p is formed in the side wall of the chamber body 12. A workpiece W (an example of the substrate) passes through the passage 12p when carried into the internal space 12s and when carried out of the internal space 12s. The passage 12p is capable of being opened/closed by a gate valve 12g.

A support portion 13 is provided on the bottom portion of the chamber body 12. The support portion 13 is formed of an insulating material. The support portion 13 has a substantially cylindrical shape. The support portion 13 extends vertically from the bottom portion of the chamber body 12 in the internal space 12s. The support portion 13 supports a stage 14. The stage 14 is installed in the internal space 12s.

The stage 14 has a lower electrode 18 and an electrostatic chuck 20. The stage 14 may further include an electrode plate 16. The electrode plate 16 is formed of a conductive material such as aluminum, and is substantially disk-shaped. The lower electrode 18 is installed on the electrode plate 16. The lower electrode 18 is formed of a conductive material such as aluminum, and is substantially disk-shaped. The lower electrode 18 is electrically connected to the electrode plate 16.

The electrostatic chuck 20 is installed on the lower electrode 18. A workpiece W is placed on the top surface of the electrostatic chuck 20. The electrostatic chuck 20 has a body formed of a dielectric material. A film-shaped electrode is installed in the body of the electrostatic chuck 20. The electrode of the electrostatic chuck 20 is connected to a DC power supply 22 via a switch. When a voltage from the DC power supply 22 is applied to the electrode of the electrostatic chuck 20, an electrostatic attractive force is generated between the electrostatic chuck 20 and the workpiece W. The workpiece W is attracted to the electrostatic chuck 20 by the generated electrostatic attractive force, and is held by the electrostatic chuck 20.

An edge ring FR is disposed on the stage 14 to surround the edge of the workpiece W. The edge ring FR is installed in order to improve the in-plane uniformity of etching. The edge ring FR may be formed of, but not limited to, silicon, silicon carbide, or quartz.

Inside the lower electrode 18, a flow path 18f is formed. A coolant is supplied to the flow path 18f from a chiller unit 26 arranged outside the chamber body 12 via a pipe 26a. The coolant supplied to the flow path 18f returns to the chiller unit 26 via a pipe 26b. In the plasma processing apparatus 10, the temperature of the workpiece W placed on the electrostatic chuck 20 is adjusted by heat exchange between the coolant and the lower electrode 18.

The plasma processing apparatus 10 includes a gas supply line 28. The gas supply line 28 supplies a heat transfer gas, such as He gas, from the heat transfer gas supply mechanism to a gap between the top surface of the electrostatic chuck 20 and the rear surface of the workpiece W.

The plasma processing apparatus 10 further includes an upper electrode 30. The upper electrode 30 is installed above the stage 14. The upper electrode 30 is supported in the upper portion of the chamber body 12 via a member 32. The member 32 is made of an insulating material. The upper electrode 30 includes an electrode plate 34, an electrostatic chuck 35 (an example of the electrostatic attractor), and a gas plate 36 (an example of the plate). The bottom surface 34c of the electrode plate 34 is the internal space 12s side, and partitions and defines the internal space 12s. The electrode plate 34 may be formed of a low-electrical resistance conductor or semiconductor that generates less Joule heat. The electrode plate 34 has gas ejection holes 34a formed therein. The gas ejection holes 34a penetrate the electrode plate 34 in the plate thickness direction.

The gas plate 36 may be formed of a conductive material such as aluminum. An electrostatic chuck 35 is disposed between the gas plate 36 and the electrode plate 34. The configuration and the voltage supply system of the electrostatic chuck 35 will be described later. The gas plate 36 and the electrode plate 34 are brought into close contact with each other due to the attractive force of the electrostatic chuck 35.

A cooling plate 37 is disposed on the gas plate 36. The cooling plate 37 may be formed of a conductive material such as aluminum. A flow path 37c is formed inside the cooling plate 37. A coolant is supplied to the flow path 37c from a chiller unit (not illustrated) arranged outside the chamber body 12. The coolant supplied to the flow path 37c is returned to the chiller unit. As a result, the temperature of the cooling plate 37 is adjusted. In the plasma processing apparatus 10, the temperature of the electrode plate 34 is adjusted by heat exchange between the coolant, the gas plate 36 and the cooling plate 37.

Inside the cooling plate 37, gas introduction paths 37a are formed so as to extend downward. Between the top surface 36b of the gas plate 36 and the bottom surface of the cooling plate 37, gas diffusion chambers 37b are installed to correspond to the gas introduction paths 37a. Gas flow paths 36a are formed inside the gas plate 36. The gas flow paths 36a are formed so as to extend in the thickness direction at positions facing the gas ejection holes 34a. The gas flow paths 36a extend downward from the gas diffusion chamber 37b so as to communicate with the corresponding gas ejection holes 34a. In the cooling plate 37, gas introduction ports 37d are installed to guide the processing gas to the gas diffusion chambers 37b. A gas supply pipe 38 is connected to the gas introduction ports 37d.

A gas supplier GS is connected to the gas supply pipe 38. In an embodiment, the gas supplier GS includes a gas source group 40, a valve group 42, and a flow rate controller group 44. The gas source group 40 is connected to the gas supply pipe 38 via the flow rate controller group 44 and the valve group 42. The gas source group 40 includes gas sources. The gas sources include sources of gases which are processing gases used in the method MT. The valve group 42 includes opening/closing valves. The flow rate controller group 44 includes flow rate controllers. Each of the flow rate controllers is a mass flow controller or a pressure-controlled flow rate controller. Each of the gas sources of the gas source group 40 is connected to the gas supply pipe 38 via a corresponding valve in the valve group 42 and a corresponding flow rate controller in the flow rate controller group 44.

In the plasma processing apparatus 10, a shield 46, which is detachable, is installed along the inner wall of the chamber body 12. The shield 46 is also installed on the outer periphery of the support portion 13. The shield 46 suppresses etching byproducts from adhering to the chamber body 12. The shield 46 is configured by, for example, coating an aluminum member with ceramic such as $Y_2O_3$.

A baffle plate 48 is installed between the support portion 13 and the side wall of the chamber body 12. The baffle plate 48 is formed by, for example, coating an aluminum member with ceramic such as $Y_2O_3$. Through holes are formed in the baffle plate 48. An exhaust port 12e is formed below the baffle plate 48 and in the bottom portion of the chamber body 12. An exhaust apparatus 50 is connected to the exhaust port 12e via an exhaust pipe 52. The exhaust apparatus 50 includes a pressure control valve and a vacuum pump such as a turbo molecular pump.

The plasma processing apparatus 10 further includes a first radio frequency (RF) power supply 62 and a second RF power supply 64 as RF power supplies. The first RF power supply 62 is a power supply configured to generate first RF waves for plasma generation. The frequency of the first RF waves is in the range of, for example, 27 MHz to 100 MHz. The first RF power supply 62 is connected to the lower electrode 18 via a matcher 66 and the electrode plate 16. The matcher 66 has a circuit configured to match the output impedance of the first RF power supply 62 with the input impedance on the load side (the lower electrode 18 side). In addition, the first RF power supply 62 may be connected to the upper electrode 30 via the matcher 66.

The second RF power source 64 is a power supply configured to generate second RF waves for drawing ions into a workpiece W. The frequency of the second RF waves is lower than the frequency of the first RF waves. The frequency of the second RF waves is in the range of, for example, 400 kHz to 13.56 MHz. The second RF power supply 64 is connected to the lower electrode 18 via a matcher 68 and the electrode plate 16. The matcher 68 has a circuit configured to match the output impedance of the second RF power supply 64 with the input impedance on the load side (the lower electrode 18 side).

The plasma processing apparatus 10 may further include a DC power supply 70. The DC power supply 70 is connected to the upper electrode 30. The DC power supply 70 is capable of generating a negative DC voltage and applying the DC voltage to the upper electrode 30.

The plasma processing apparatus 10 may further include a controller Cnt. The controller Cnt may be a computer including, for example, a processor, a storage part, an input device, and a display device. The controller Cnt controls each part of the plasma processing apparatus 10. In the controller Cnt, an operator is capable of performing, for example, an input operation of a command to manage the plasma processing apparatus 10 using an input device. In addition, in the controller Cnt, the operation situation of the plasma processing apparatus 10 may be visualized and displayed on the display device. Furthermore, the storage part of the controller Cnt stores a control program and recipe data for controlling, by a processor, various processes executed in the plasma processing apparatus 10. The method to be described later is executed in the plasma processing apparatus 10 when the processor of the controller Cnt executes the control program to control each part of the plasma processing apparatus 10 according to the recipe data.

Figure 3:
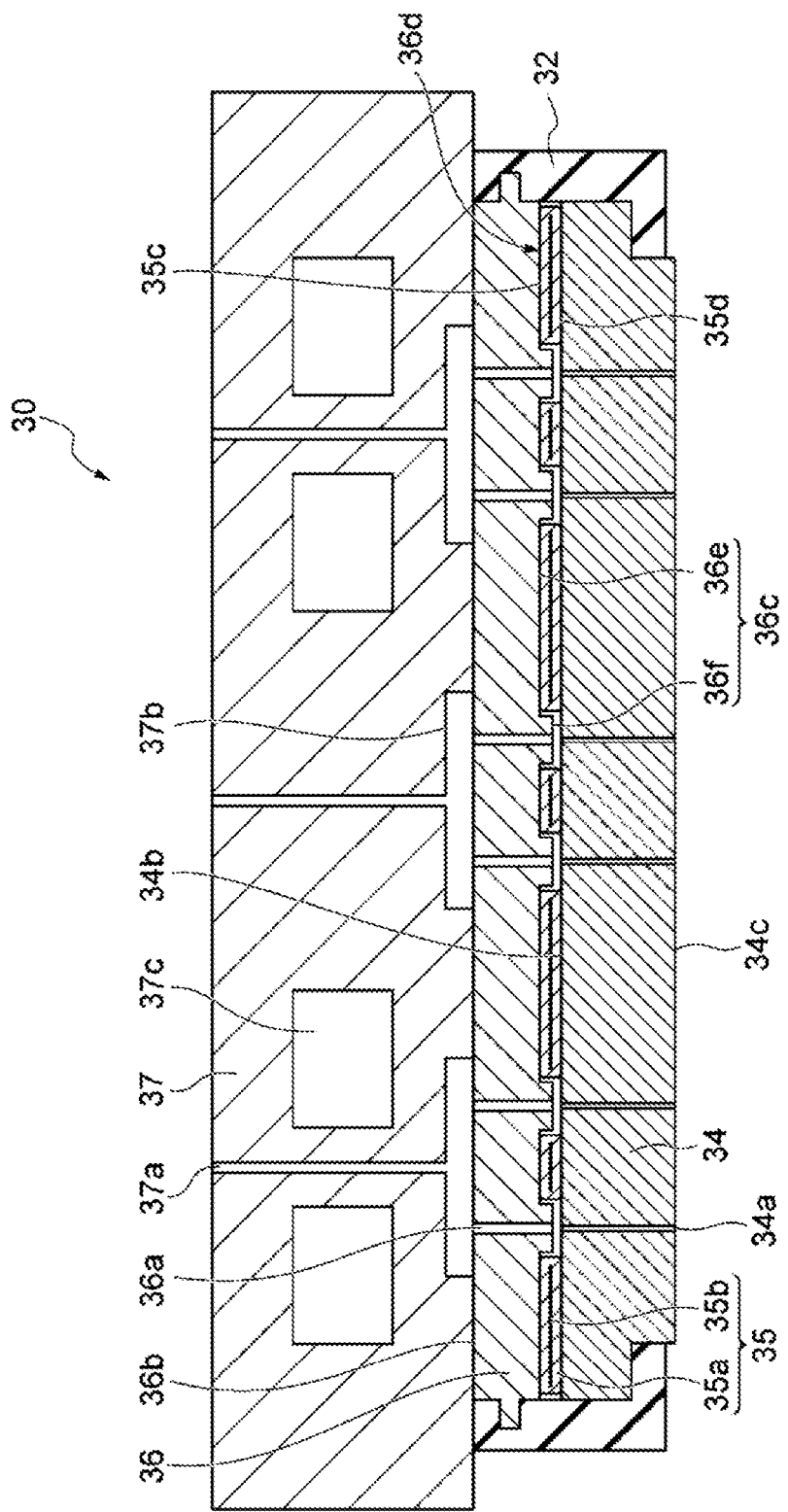
FIG. 3 is a cross-sectional view illustrating an upper electrode according to an exemplary embodiment.

FIG. 3 is a cross-sectional view illustrating an upper electrode according to an exemplary embodiment. As illustrated in FIG. 3, the upper electrode 30 has a structure in which the electrode plate 34, the gas plate 36, and the cooling plate 37 are stacked in that order from the bottom. The electrode plate 34, the gas plate 36, and the cooling plate 37 may be a plate member or a pillar member having a circular shape. The electrode plate 34, the gas plate 36, and the cooling plate 37 may be arranged coaxially.

The electrostatic chuck 35 is interposed between the electrode plate 34 and the gas plate 36. The top surface of the electrostatic chuck 35 is a contact surface 35c, which is in contact with the bottom surface 36c of the gas plate 36, and is fixed to the bottom surface 36c of the gas plate 36 using an adhesive or the like. The bottom surface of the electrostatic chuck 35 is an attraction surface 35d, which attracts the top surface 34b of the electrode plate 34.

The bottom surface 36c of the gas plate 36 may have a first area 36e facing the contact surface 35c of the electrostatic chuck 35 and a second area 36f facing the gas ejection hole 34a. The second area 36f protrudes below the first area 36e so as to form the accommodation portion 36d. The electrostatic chuck 35 is arranged in the accommodation portion 36d.

The electrostatic chuck 35 has a body portion 35a formed of a dielectric material. The body portion 35a has elasticity. An electrode 35b is installed inside the body portion 35a. The electrode 35b is connected to the DC power supply. The connection with the DC power supply will be described later. When a voltage from the DC power source is applied to the electrode 35b of the electrostatic chuck 35, an electrostatic attractive force is generated between the electrostatic chuck 35 and the electrode plate 34. The electrode plate 34 is attracted to the electrostatic chuck 35 by the generated electrostatic attractive force so as to be held by the electrostatic chuck 35. FIG. 3 illustrates the upper electrode 30 in a state in which no voltage is applied to the electrostatic chuck 35. The thickness of the electrostatic chuck 35 before applying the voltage is greater than the protrusion length of the second area 36f with respect to the first area 36e.

Figure 4:
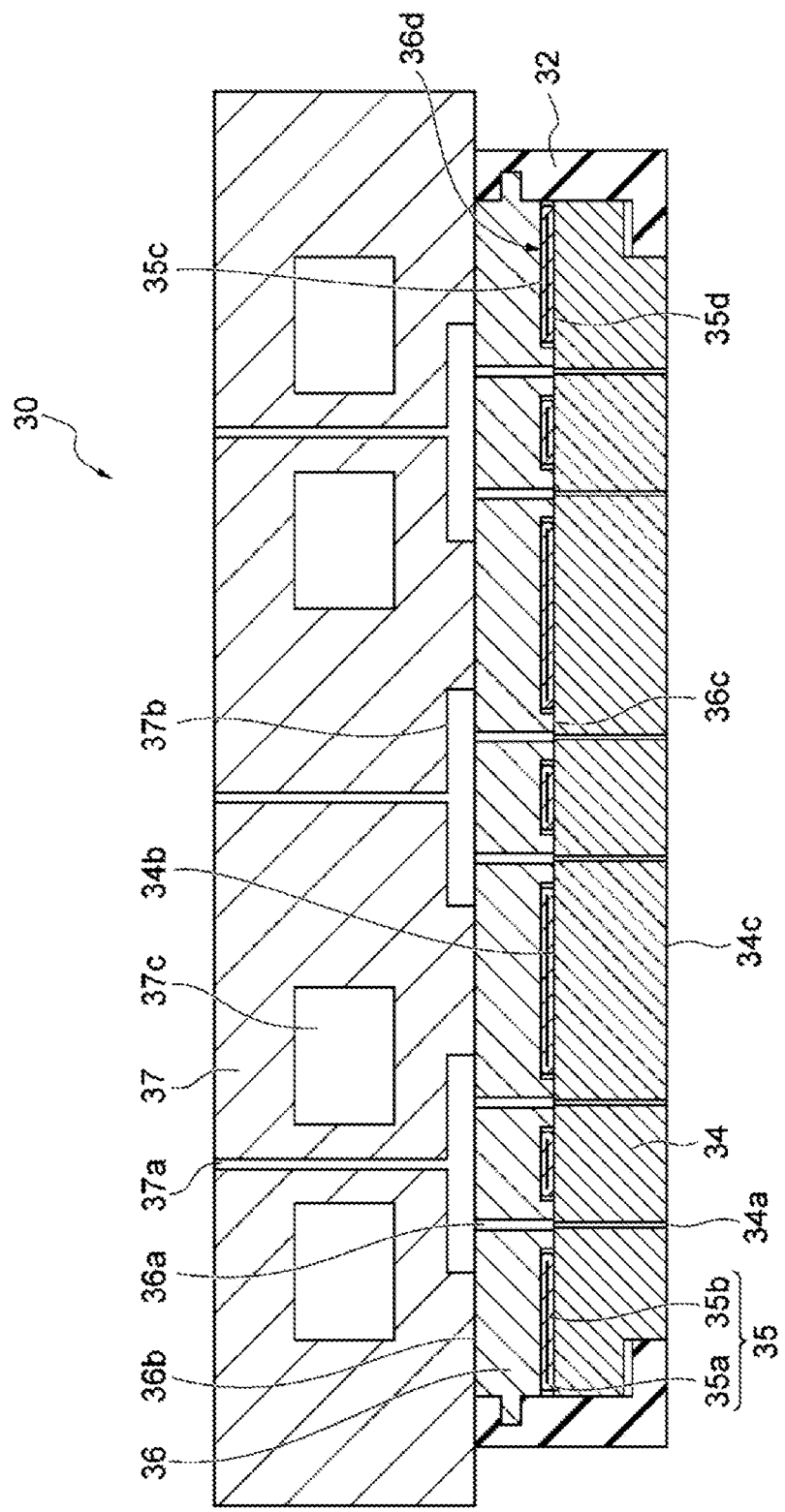
FIG. 4 is a cross-sectional view illustrating an upper electrode according to an exemplary embodiment.

FIG. 4 is a cross-sectional view illustrating an upper electrode according to an exemplary embodiment. FIG. 4 illustrates a state in which a voltage is applied to the electrostatic chuck 35 in FIG. 3. As illustrated in FIG. 4, when a voltage is applied to the electrostatic chuck 35, the electrostatic chuck 35 attracts the electrode plate 34 to the gas plate 36. At this time, the electrostatic chuck 35 is sandwiched between the electrode plate 34 and the gas plate 36, thereby being compressed. Since the body portion 35a of the electrostatic chuck 35 has elasticity, the body portion 35a is compressed and pushed into the accommodation portion 36d. Then, when the top surface 34b of the electrode plate 34 abuts against the bottom surface 36c of the gas plate 36, the ascent of the electrode plate 34 is stopped. In this way, the electrostatic chuck 35 is arranged in a state in which the body portion 35a is compressed between the electrode plate and the gas plate by the action of the electrostatic chuck 35. The thickness of the electrostatic chuck 35 after applying the voltage is the same as the protrusion length of the second area 36f with respect to the first area 36e. Therefore, the top surface 34b of the electrode plate 34 is in close contact with the bottom surface 36c of the gas plate 36.

Figure 5:
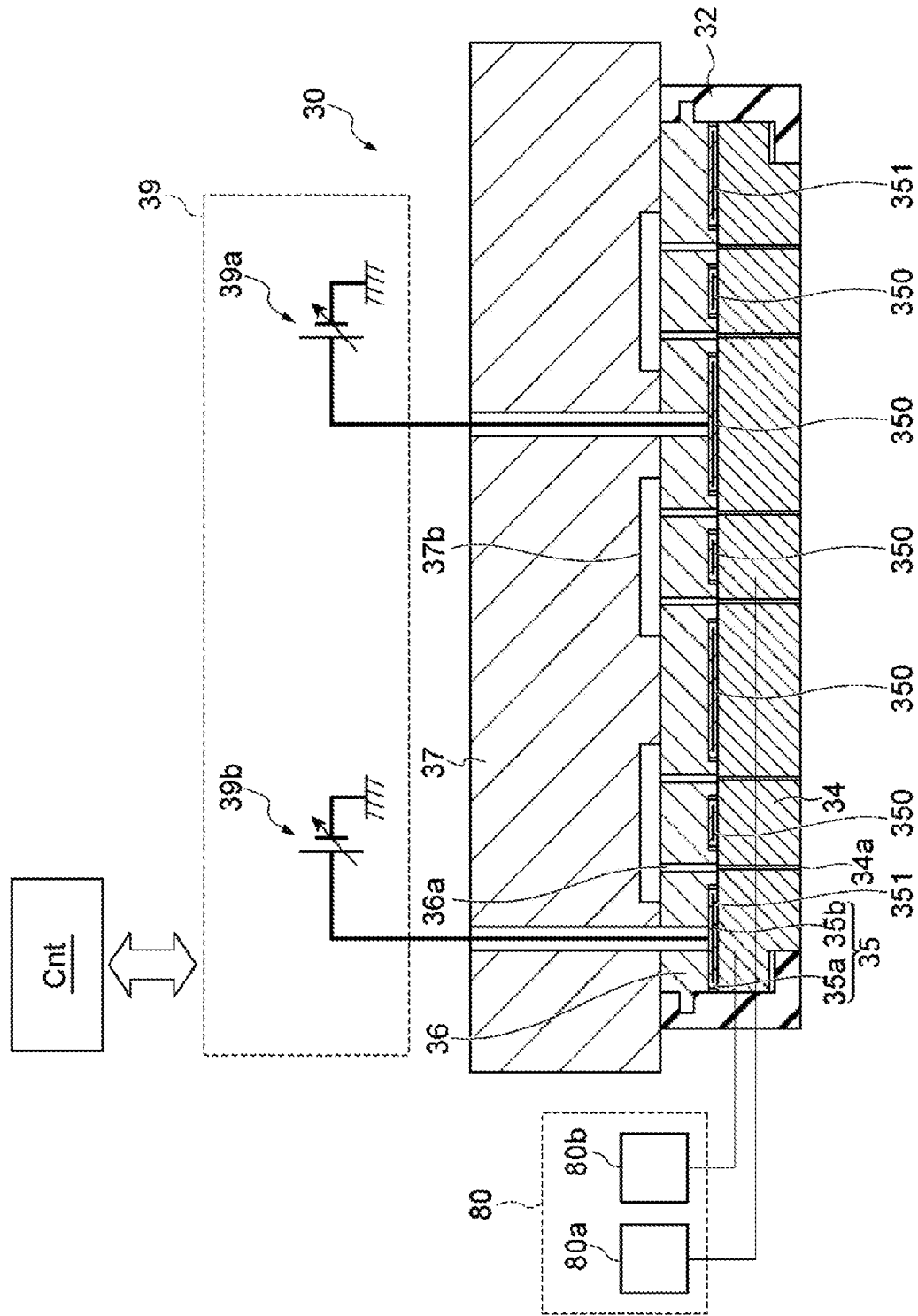
FIG. 5 is a cross-sectional view illustrating an upper electrode according to an exemplary embodiment.
Figure 6:
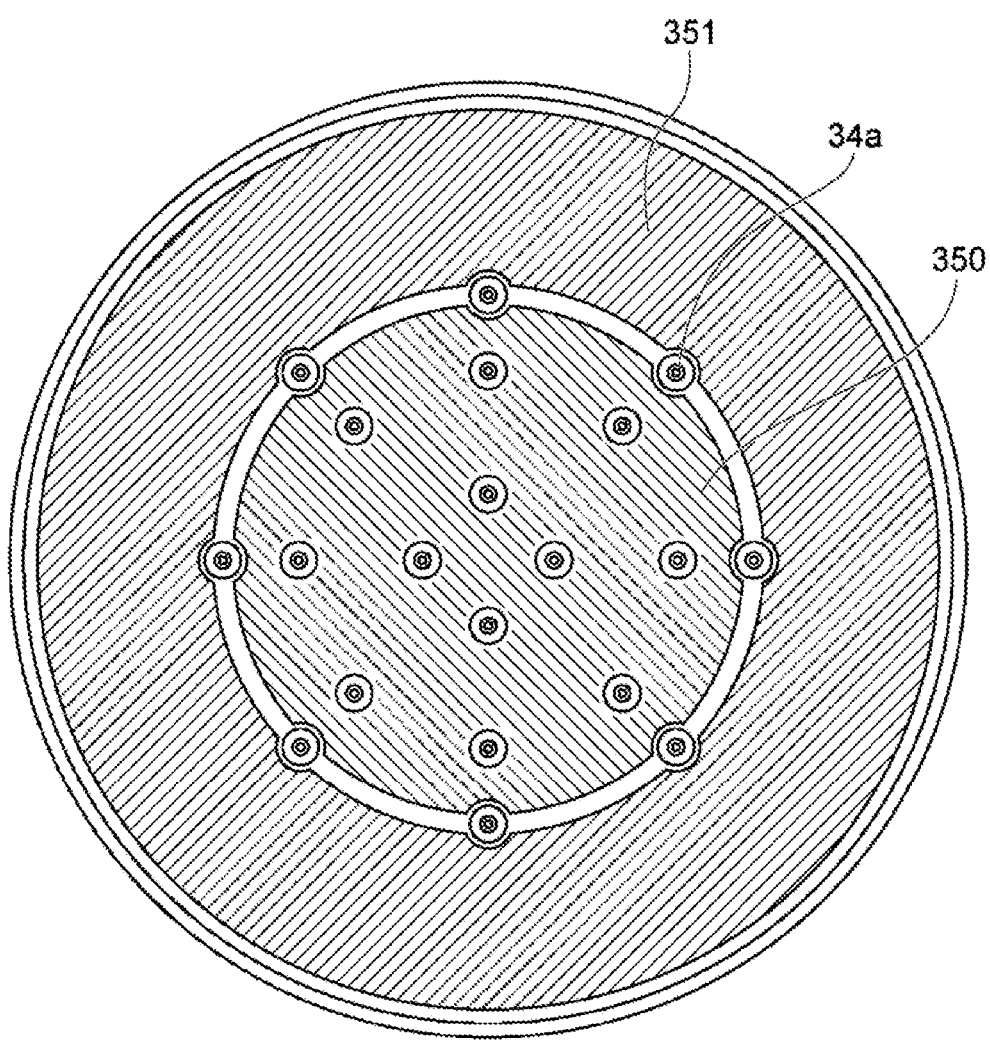
FIG. 6 is a view schematically illustrating an exemplary layout of a first electrode and a second electrode.

FIG. 5 is a cross-sectional view illustrating an upper electrode according to an exemplary embodiment. As illustrated in FIG. 5, a power supply 39 controlled by the controller Cnt is connected to the electrostatic chuck 35. The power supply 39 is a DC power supply having a variable applied voltage. The power supply 39 includes a first DC power supply 39a and a second DC power supply 39b. Although two DC power supplies are illustrated here, the number of DC power supplies is not limited. The number of DC power supplies may correspond to the number of electrodes to be controlled in the electrostatic chuck 35. That is, in the example of FIG. 4, the electrostatic chuck 35 includes a first electrode 350 and a second electrode 351. FIG. 6 is a view schematically illustrating an exemplary layout of a first electrode and a second electrode. As illustrated in FIGS. 5 and 6, the first electrode 350 is arranged in the center of the electrostatic chuck 35. The first electrode 350 is arranged at a position corresponding to the center of the electrode plate 34. Outside the first electrode 350, the second electrode 351 is arranged so as to surround the circumference of the first electrode 350. That is, the second electrode 351 is arranged at a position closer to the outer circumference of the electrode plate 34 than the first electrode 350. The first electrode 350 and the second electrode 351 have a shape in which the peripheries of the gas ejection holes 34a are cut off. The body portions of the first electrode 350 and the second electrode 351 may be separate as a single first body portion and a single second body portion, respectively, or may be an integral single body portion. Hereinafter, for convenience, the configuration of the electrostatic chuck 35 related to the first electrode 350 is also referred to as a first attractor, and the configuration of the electrostatic chuck 35 related to the second electrode 351 is also referred to as a second attractor.

Voltages having different polarities may be applied to the first electrode 350 and the second electrode 351, respectively. In this case, the electrostatic chuck 35 attracts the electrode plate 34 in a bipolar manner. Voltages having the same polarity may be applied to the first electrode 350 and the second electrode 351, respectively. In this case, the electrostatic chuck 35 attracts the electrode plate 34 in a unipolar manner.

In the electrode plate 34 a temperature sensor 80 is installed. The temperature sensor 80 detects a temperature distribution of the electrode plate 34. The temperature distribution is the temperature for each position. The temperature sensor 80 may include a first temperature sensor 80a and a second temperature sensor 80b. The first temperature sensor 80a detects the temperature in the central area of the electrode plate 34. That is, the first temperature sensor 80a detects the temperature of the electrode plate 34 at a position where the first electrode 350 is disposed (i.e., the temperature of a portion of the electrode plate 34, which is below the first electrode 350). The second temperature sensor 80b detects the temperature of an area outside the central area (i.e., the area surrounding the central area) of the electrode plate 34. That is, the second temperature sensor 80b detects the temperature of the electrode plate 34 at a position where the second electrode 351 is disposed (i.e., the temperature of a portion of the electrode plate 34, which is below the second electrode 351). An example of the temperature sensor 80 may be a thermocouple. The detection result of the temperature sensor 80 is output to the controller Cnt. Although two temperature sensors are illustrated here, the number and arrangement of the temperature sensors are not limited. The temperature distribution may be detected when the apparatus includes at least two temperature sensors.

The controller Cnt controls the power supply 39 according to the temperature distribution of the electrode plate 34 acquired by the temperature sensor 80. The controller Cnt controls the power supply 39 to apply a first voltage to the first electrode 350 and to apply a second voltage to the second electrode 351. The first voltage and the second voltage are determined based on the temperature distribution. When the temperature of the electrode plate 34 is made uniform, the controller Cnt sets the first voltage and the second voltage such that a higher voltage is applied to the electrode corresponding to the area where the temperature of the electrode plate 34 is high. For example, when the central area of the electrode plate 34 has a higher temperature than the outer area, the first voltage is set to be higher than the second voltage. The controller Cnt may adjust the temperature distribution of the electrode plate 34 by repeating the acquisition of the temperature distribution and the determination and application of the voltage. The controller Cnt may execute the above-mentioned repetition until the difference between the detection temperature of the first temperature sensor 80a and the detection temperature of the second temperature sensor 80b becomes equal to or lower than a predetermined temperature threshold. The controller Cnt may adjust the temperature distribution of the electrode plate 34 while executing the plasma processing of a substrate.

The controller Cnt is capable of not only making the temperature on the electrode plate 34 uniform, but also adjusting the temperature of a portion of the electrode plate 34. The controller Cnt may increase the second voltage when it is desired to further cool the central area of the electrode plate 34 based on the temperature distribution of the electrode plate 34. Alternatively, the controller Cnt may increase the second voltage when it is desired to further cool the outer area of the electrode plate 34 based on the temperature distribution of the electrode plate 34.

[Details of Plasma Processing Method]

Hereinafter, the method MT will be described with reference to FIG. 1 again. Here, an example in which a substrate is processed by plasma in the plasma processing apparatus 10 illustrated in FIG. 2 will be described. As illustrated in FIG. 1, the method MT includes a step of acquiring a temperature distribution (S10), a step of applying a voltage to an electrostatic chuck (S12), and a step of processing a substrate with plasma (S14). Before executing the method MT, the controller Cnt carries a substrate to be processed into the chamber body 12.

In step S10, the controller Cnt acquires the temperature distribution of the electrode plate 34 based on the detection result of the temperature sensor 80.

In step S12, the controller Cnt determines the first voltage and the second voltage according to the temperature distribution acquired in step S10. The controller Cnt applies a first voltage to the first electrode 350 and applies a second voltage to the second electrode 351. As a result, the temperature of the electrode plate 34 is made uniform.

In step S14, the controller Cnt processes the substrate with plasma. The controller Cnt introduces a process gas into the processing space by the gas supplier GS. The controller Cnt applies RF waves from the first RF power supply 62 and the second RF power supply 64 so as to generate plasma. As a result, the substrate is processed by plasma. When the step S14 is completed, the method MT is completed.

The method MT may have a step of repeating steps S10, S12, and S14. The plasma generated in step S14 may cause a difference in the temperature distribution of the electrode plate 34. In the method MT, the controller Cnt may control the power supply 39 such that the difference between the detection temperature of the first temperature sensor 80a and the detection temperature of the second temperature sensor 80b is equal to or smaller than a predetermined temperature threshold.

[Relationship Between Temperature Distribution and DC Voltage]

Figure 7A:
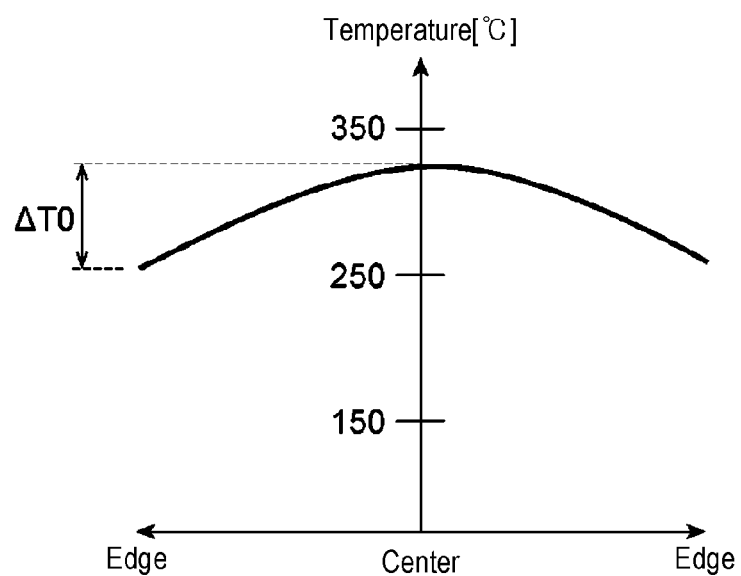
FIG. 7A illustrates an exemplary temperature distribution of an electrode plate.
Figure 7B:
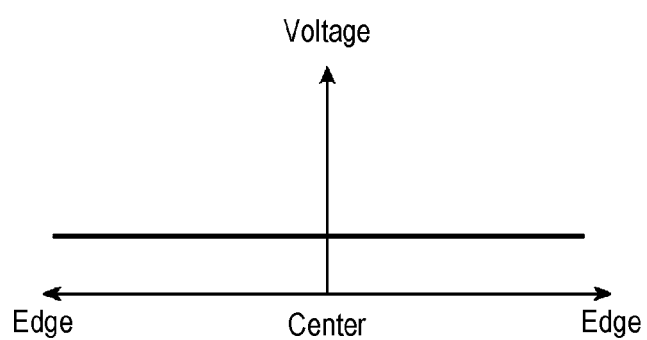
FIG. 7B illustrates an exemplary distribution of a voltage applied to an electrostatic chuck.

When a DC voltage applied to the electrostatic chuck 35 is constant regardless of a position on the electrode plate 34, the temperature distribution is as follows. FIG. 7A illustrates an exemplary temperature distribution of an electrode plate. The horizontal axis represents the position on the electrode plate 34 with the center of the electrode plate 34 as the origin, and the vertical axis represents the temperature. FIG. 7A illustrates a temperature distribution when the voltage shown in FIG. 7B is applied. FIG. 7B illustrates an exemplary distribution of a voltage applied to an electrostatic chuck. The horizontal axis represents the position on the electrode plate 34 with the center of the electrode plate 34 as the origin, and the vertical axis represents the voltage. As shown in FIG. 7B, the same voltage is applied in the plane of the electrode plate 34. Therefore, the same attractive force is generated in the plane of the electrode plate 34. As shown in FIG. 7A, the temperature distribution has a peak shape in which the temperature increases from the edge of the electrode plate 34 toward the center and becomes the maximum at the center of the electrode plate 34. There is a temperature difference $\Delta T0$ between the edge and the center of the electrode plate 34. In order to reduce the temperature difference $\Delta T0$, it is necessary to change the voltage applied to the electrode plate 34 for each area.

Figure 8A:
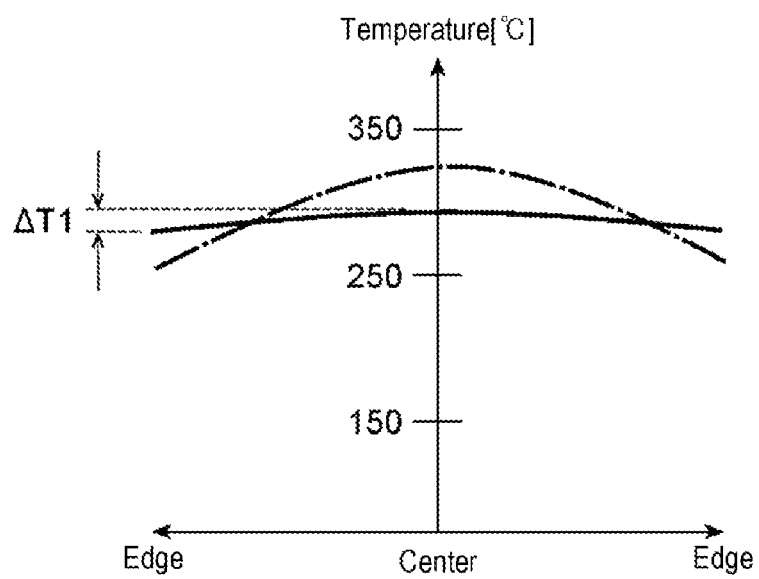
FIG. 8A illustrates another exemplary temperature distribution of an electrode plate.
Figure 8B:
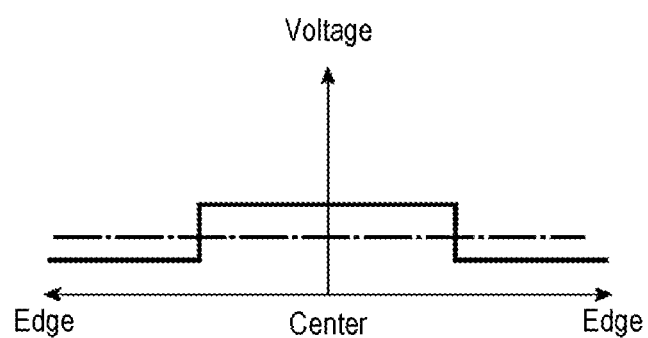
FIG. 8B illustrates another exemplary distribution of a voltage applied to the electrostatic chuck.

When the DC voltage applied to the electrostatic chuck 35 differs for each position (area) of the electrode plate 34, the temperature distribution becomes as follows. FIG. 8A illustrates another exemplary temperature distribution of an electrode plate. The horizontal axis represents the position on the electrode plate 34 with the center of the electrode plate 34 as the origin, and the vertical axis represents the temperature. The solid line illustrates an example in which the DC voltage differs for each area, and the one-dot chain line represents the temperature shown in FIG. 7A, which is shown for comparison. FIG. 8A illustrates a temperature distribution when the voltage shown in FIG. 8B is applied to the electrostatic chuck. FIG. 8B illustrates an exemplary distribution of the voltage applied to the electrostatic chuck. The horizontal axis represents the position on the electrode plate 34 with the center of the electrode plate 34 as the origin, and the vertical axis represents the voltage. The solid line illustrates an example in which the DC voltage differs for each area, and the one-dot chain line represents the voltage shown in FIG. 7B, which is shown for comparison.

As shown in FIG. 8B, the applied voltage in the central area of the electrode plate 34 (the voltage applied to the first electrode 350) is set to be greater than the applied voltage in the outer area of the electrode plate 34 (the voltage applied to the second electrode 351). As a result, heat emission in the central area of the electrode plate 34 is further promoted than heat emission in the outer area of the electrode plate 34. In addition, the applied voltage in the central area of the electrode plate 34 is set to be greater than the voltage shown in FIG. 7B. Therefore, in the central area of the electrode plate 34, a greater attractive force is generated compared with the example shown in FIG. 7B, and a greater amount of heat is conducted to the gas plate 36. As a result, as shown in FIG. 8A, the temperature of the central area of the electrode plate 34 becomes lower than that in the example shown in FIG. 7B.

In addition, as shown in FIG. 8B, the applied voltage in the outer area of the electrode plate 34 (the voltage applied to the second electrode 351) is set to be smaller than the voltage shown in FIG. 7B. Therefore, in the outer area of the electrode plate 34, a smaller attractive force is generated compared with the example shown in FIG. 7B, and a smaller amount of heat is conducted to the gas plate 36. As a result, as shown in FIG. 8A, the temperature of the outer area of the electrode plate 34 becomes higher than that in the example shown in FIG. 7B.

The controller Cnt is capable of implementing a uniform temperature in the plane of the electrode plate 34 by lowering the temperature of the central area of the electrode plate 34 and raising the temperature of the outer area of the electrode plate 34. As shown in FIG. 8A, the temperature difference between the edge and the center of the electrode plate 34 may be set to $\Delta T1$ ($<\Delta T0$).

[Modification of Electrostatic Chuck]

Figure 9A:
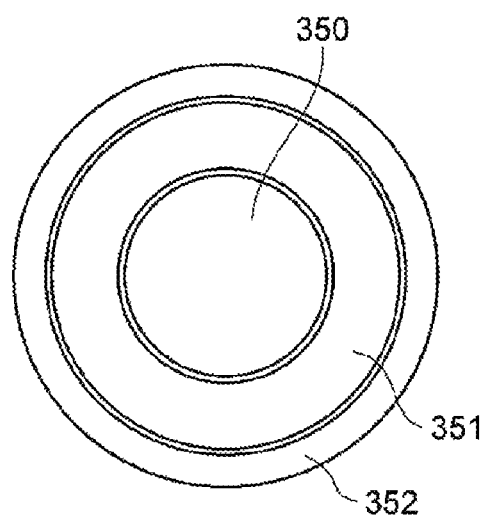
FIG. 9A illustrates an exemplary electrode arrangement.
Figure 9B:
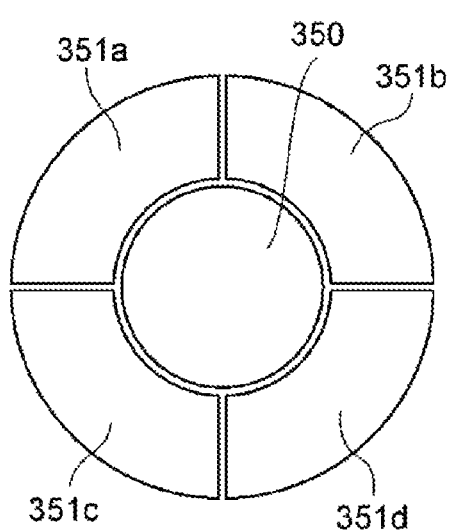
FIG. 9B illustrates another exemplary electrode arrangement.
Figure 9C:
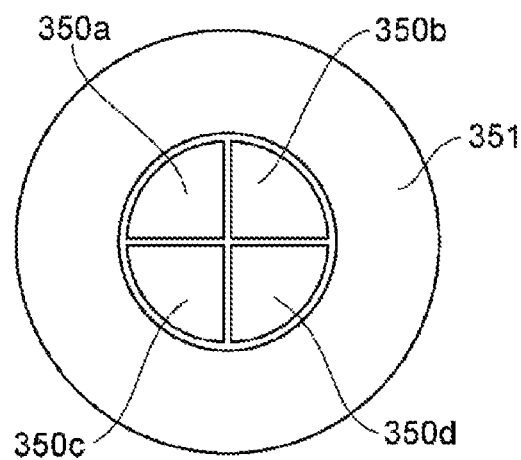
FIG. 9C illustrates still another exemplary electrode arrangement.
Figure 9D:
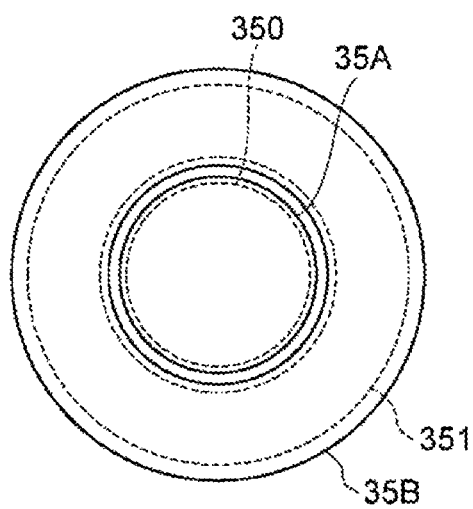
FIG. 9D illustrates an example in which the body of the electrostatic chuck is separated.

The electrostatic chuck 35 is not limited to the electrode arrangement shown in FIG. 6. FIG. 9A illustrates an exemplary electrode arrangement. As illustrated in FIG. 9, the electrostatic chuck 35 may include a third electrode 352 in addition to the first electrode 350 and the second electrode 351. FIG. 9B illustrates another exemplary electrode arrangement. As illustrated in FIG. 9B, the second electrode 351 may be divided (into four portions 351a, 351b, 351c, and 351d). FIG. 9C illustrates another exemplary electrode arrangement. As illustrated in FIG. 9C, the first electrode 350 may be divided (into four portions 350a, 350b, 350c, and 350d). FIG. 9D illustrates an example in which the body of the electrostatic chuck is separated. As illustrated in FIG. 9D, the electrostatic chuck 35 has a first body 35A and a second body 35B, which may be provided therein with a first electrode 350 and a second electrode 351, respectively.

Although various exemplary embodiments have been described above, the present disclosure is not limited to the exemplary embodiments described above, and various omissions, substitutions, and changes may be made. In addition, elements in different embodiments may be combined to form other embodiments.

For example, the plasma processing apparatus 10 is a capacitively-coupled plasma processing apparatus, but in another embodiment, the plasma processing apparatus may be another type of plasma processing apparatus. Such a plasma processing apparatus may be any type of plasma processing apparatus. Such a plasma processing apparatus may be, for example, an inductively-coupled plasma processing apparatus or a plasma processing apparatus configured to generate plasma using surface waves such as microwaves.

In the illustrated example, two RF power supplies are connected to the lower electrode 18 and a DC power supply is connected to the upper electrode 30, but the plasma processing apparatus 10 is not limited thereto. For example, in the plasma processing apparatus 10, an RF power supply may be connected to the lower electrode 18 and the upper electrode 30. In addition, the gas plate 36 and the cooling plate 37 may be integrated to form a plate.

The material of the body of the electrostatic chuck 35 is not limited to the elastic dielectric material, and may be ceramic or the like.

The gas plate 36 and the electrode plate 34 do not have to be in close contact with each other, and may be connected via a heat conductive member. That is, the electrode plate 34 may be arranged below the gas plate 36 so as to adjust the temperature.

According to an exemplary embodiment, it is possible to flexibly adjust the temperature distribution of the upper electrode plate when processing a substrate with plasma.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:
a chamber configured to accommodate a substrate;
an RF power supply for plasma generation;
an upper electrode structure forming an upper portion of the chamber and including a temperature-controlled plate, an electrode plate disposed below the temperature-controlled plate,
and an electrostatic attractor interposed between the temperature-controlled plate and the electrode plate, the electrostatic attractor including a contact surface which is in contact with a bottom surface of the temperature-controlled plate, an attraction surface configured to attract a top surface of the electrode plate, a first electrode, and a second electrode;
a power supply configured to apply a voltage to the first electrode and the second electrode;
a temperature obtaining portion configured to acquire a temperature distribution of the electrode plate; and
a controller,
wherein the controller is configured to execute a process including:
acquiring, by the temperature obtaining portion, the temperature distribution of the electrode plate;
applying a first voltage to the first electrode and applying a second voltage to the second electrode according to the acquired temperature distribution by controlling the power supply; and
processing the substrate with plasma.

2. The plasma processing apparatus of claim 1, wherein the electrode plate is circular,
the first electrode is disposed at a position corresponding to a center of the electrode plate, and
the second electrode is disposed to surround a periphery of the first electrode.

3. The plasma processing apparatus of claim 2, wherein the temperature obtaining portion includes a first temperature sensor configured to detect a temperature of the electrode plate at a position where the first electrode is disposed and a second temperature sensor configured to detect a temperature of the electrode plate at a position where the second electrode is disposed.

4. The plasma processing apparatus of claim 3, wherein the applying the first voltage and the second voltage includes applying a voltage to the first electrode and the second electrode such that a difference between a detected temperature of the first temperature sensor and a detected temperature of the second temperature sensor is equal to or smaller than a predetermined temperature threshold.

5. The plasma processing apparatus of claim 4, wherein the electrostatic attractor includes a single body made of a dielectric material, and
the first electrode and the second electrode are installed inside the single body.

6. The plasma processing apparatus of claim 5, wherein the single body is made of ceramic.

7. The plasma processing apparatus of claim 6, wherein the process executed by the controller further includes: repeating the acquiring the temperature distribution, the applying the first voltage and the second voltage, and the processing the substrate.

8. The plasma processing apparatus of claim 5, wherein the single body is made of an elastic dielectric material.

9. The plasma processing apparatus of claim 1, wherein the temperature obtaining portion includes a first temperature sensor configured to detect a temperature of the electrode plate at a position where the first electrode is disposed and a second temperature sensor configured to detect a temperature of the electrode plate at a position where the second electrode is disposed.

10. The plasma processing apparatus of claim 1, wherein the electrostatic attractor includes a single body made of a dielectric material, and
the first electrode and the second electrode are installed inside the single body.

11. The plasma processing apparatus of claim 1, wherein the electrostatic attractor includes a first body made of a dielectric material and a second body separated from the first body and made of a dielectric material,
the first electrode is installed inside the first body, and
the second electrode is installed inside the second body.

12. The plasma processing apparatus of claim 11, wherein the first body and the second body are made of ceramic.

13. The plasma processing apparatus of claim 11, wherein the first body and the second body are made of an elastic dielectric material.

14. The plasma processing apparatus of claim 1, wherein the process executed by the controller further includes: repeating the acquiring the temperature distribution, the applying the first voltage and the second voltage, and the processing the substrate.

15. The plasma processing apparatus of claim 1, wherein the electrostatic attractor is fixed to the temperature-controlled plate using an adhesive.

16. The plasma processing apparatus of claim 1, wherein the bottom surface of the temperature-controlled plate includes an accommodation portion, and
wherein the electrostatic attractor is arranged in the accommodation portion.

17. The plasma processing apparatus of claim 1, wherein a gas flow path is formed inside the temperature-controlled plate,
wherein a gas ejection hole is formed in the electrode plate, and wherein the temperature-controlled plate and the electrode plate are installed such that the gas flow path communicates with the gas ejection hole.

18. The plasma processing apparatus of claim 1, wherein the bottom surface of the temperature-controlled plate includes a protrusion, and
wherein a gas flow path is formed inside the temperature-controlled plate and penetrates through the protrusion of the temperature-controlled plate.

* * * * *